United States Patent
Shiga et al.

(10) Patent No.: US 9,324,616 B2
(45) Date of Patent: Apr. 26, 2016

(54) METHOD OF MANUFACTURING FLIP-CHIP TYPE SEMICONDUCTOR DEVICE

(71) Applicant: NITTO DENKO CORPORATION, Ibaraki-shi, Osaka (JP)

(72) Inventors: Goji Shiga, Ibaraki (JP); Fumiteru Asai, Ibaraki (JP); Naohide Takamoto, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

(21) Appl. No.: 14/373,030

(22) PCT Filed: Jan. 15, 2013

(86) PCT No.: PCT/JP2013/050580
§ 371 (c)(1),
(2) Date: Jul. 17, 2014

(87) PCT Pub. No.: WO2013/108755
PCT Pub. Date: Jul. 25, 2013

(65) Prior Publication Data
US 2014/0361443 A1     Dec. 11, 2014

(30) Foreign Application Priority Data

Jan. 18, 2012 (JP) .................................. 2012-008148

(51) Int. Cl.
H01L 21/44     (2006.01)
H01L 23/48     (2006.01)
(Continued)

(52) U.S. Cl.
CPC ............ *H01L 21/78* (2013.01); *H01L 21/6836* (2013.01); *H01L 23/544* (2013.01);
(Continued)

(58) Field of Classification Search
CPC ..... H01L 21/78; H01L 23/544; H01L 23/562; H01L 2223/54473; H01L 21/6836; H01L 24/27

USPC ........................................... 257/778; 438/108
See application file for complete search history.

(56) References Cited

U.S. PATENT DOCUMENTS 6,023,094 A  *  2/2000  Kao et al. ..................... 257/632
2002/0137309 A1    9/2002  Senoo et al.
(Continued)

FOREIGN PATENT DOCUMENTS

CN    1910238 A     2/2007
JP    2002280329 A  9/2002
(Continued)

OTHER PUBLICATIONS

ISA Japanese Patent Office, International Search Report of PCT/JP2013/050580, Apr. 23, 2013, WIPO, 2 pages.
(Continued)

*Primary Examiner* — Hung Vu
(74) *Attorney, Agent, or Firm* — Alleman Hall McCoy Russell & Tuttle LLP

(57) ABSTRACT

An object of the present invention is to provide a method of manufacturing a flip-chip type semiconductor device with a simplified process, in which various types of information are supplied in a visually recognizable manner. The present invention relates to a method of manufacturing a flip-chip type semiconductor device comprising: a step A of laminating on a semiconductor wafer a film for the backside of a flip-chip type semiconductor, in which the film is to be formed on the backside of a semiconductor element that is flip-chip connected onto an adherend; a step B of dicing the semiconductor wafer; and a step C of laser marking the film for the backside of a flip-chip type semiconductor, wherein the film for the backside of a flip-chip type semiconductor in the step C is uncured.

3 Claims, 1 Drawing Sheet

(51) Int. Cl.
*H01L 21/78* (2006.01)
*H01L 23/00* (2006.01)
*H01L 23/544* (2006.01)
*H01L 21/683* (2006.01)

(52) U.S. Cl.
CPC .............. *H01L23/562* (2013.01); *H01L 24/81* (2013.01); *H01L 23/564* (2013.01); *H01L 24/13* (2013.01); *H01L 24/16* (2013.01); *H01L 2221/68336* (2013.01); *H01L 2221/68377* (2013.01); *H01L 2221/68381* (2013.01); *H01L 2221/68386* (2013.01); *H01L 2223/54413* (2013.01); *H01L 2223/54473* (2013.01); *H01L 2223/54486* (2013.01); *H01L 2224/13111* (2013.01); *H01L 2224/13144* (2013.01); *H01L 2224/13147* (2013.01); *H01L 2224/16225* (2013.01); *H01L 2224/16245* (2013.01); *H01L 2224/73204* (2013.01); *H01L 2224/81193* (2013.01); *H01L 2224/81815* (2013.01); *H01L 2224/831* (2013.01); *H01L 2924/12042* (2013.01); *H01L 2924/15787* (2013.01); *H01L 2924/15788* (2013.01); *H01L 2924/3512* (2013.01)

(56) References Cited

U.S. PATENT DOCUMENTS

| 2010/0314781 | A1* | 12/2010 | Hayashi et al. | 257/778 |
| 2011/0156280 | A1* | 6/2011 | Takamoto et al. | 257/778 |
| 2013/0095639 | A1 | 4/2013 | Takamoto et al. | |

FOREIGN PATENT DOCUMENTS

| JP | 2004260190 A | 9/2004 |
| JP | 2011228499 A | 11/2011 |
| JP | 2011249739 A | 12/2011 |

OTHER PUBLICATIONS

International Bureau of WIPO, International Preliminary Report of PCT/JP2013/050580, Jul. 31, 2014, Switzerland, 6 pages.

State Intellectual Property Office of the People's Republic of China, First Office Action Issued in Patent Application No. 201380005859.5, Feb. 19, 2016, 13 pages.

* cited by examiner

METHOD OF MANUFACTURING FLIP-CHIP TYPE SEMICONDUCTOR DEVICE

TECHNICAL FIELD

The present invention relates to a method of manufacturing a flip-chip type semiconductor device and a flip-chip type semiconductor device obtained with the manufacturing method.

BACKGROUND ART

In recent years, there have been increasing demands for thickness reduction and size reduction of semiconductor devices and packages thereof. Because of that, a flip-chip type semiconductor device has been broadly used in which a semiconductor element such as a semiconductor chip is mounted on a substrate by flip-chip bonding (flip-chip connection) to form a semiconductor device and a package thereof.

In flip-chip connection, a semiconductor chip is fixed to a substrate in a condition that the circuit surface of the semiconductor chip is opposite to the electrode forming surface of the substrate. There are cases where damage to the semiconductor chip is prevented by protecting the backside of the semiconductor chip with a protective film in such a semiconductor device.

However, it is necessary to add a new step of pasting a protecting film to the backside of the semiconductor chip that is obtained in a dicing step to protect the backside of the semiconductor chip with the protecting film. As a result, the number of steps increases and manufacturing cost increases. In addition, the semiconductor chip may be damaged in a pickup step thereof as the semiconductor device has become thinner in recent years. Because of this, a semiconductor wafer or the semiconductor chip is desired to be reinforced up to the pickup step to increase its mechanical strength.

It has been conventionally required to supply various types of information (for example, character information such as product numbers and graphic information such as two-dimensional codes) in a visually recognizable manner on a manufactured semiconductor chip and a semiconductor device that is manufactured using the semiconductor chip for the purpose of managing the product, etc.

As methods of manufacturing a semiconductor chip, known methods include a step of peeling a protective film forming layer and a release sheet, a step of curing the protective film forming layer by heating or by energy ray irradiation, and a step of dicing a semiconductor wafer and the protective film forming layer for each circuit (for example, refer to Patent Documents 1 and 2). However, in the methods described in Patent Documents 1 and 2, various types of information are necessary to be supplied on the semiconductor chip after the protective film forming layer is cured.

PRIOR ART DOCUMENTS

Patent Documents

Patent Document 1: JP-A-2002-280329
Patent Document 2: JP-A-2004-260190

SUMMARY OF THE INVENTION

Problems to be Solved by the Invention

An object of the present invention is to provide a method of manufacturing a flip-chip type semiconductor device with a simplified process, in which various types of information are supplied in a visually recognizable manner.

Means for Solving the Problems

In order to achieve the above-described object, the present inventors have found that the manufacturing method includes: a step A of laminating on a semiconductor wafer a film for the backside of a flip-chip type semiconductor, in which the film is to be formed on the backside of a semiconductor element that is flip-chip connected onto an adherend; a step B of dicing the semiconductor wafer; and a step C of laser marking the uncured film for the backside of a flip-chip type semiconductor, and have completed the present invention.

Because the manufacturing method of the present invention does not include a step of curing the film for the backside of a flip-chip type semiconductor before the step C as described above, the manufacturing process can be simplified. In addition, a semiconductor element of the flip-chip type semiconductor device that is obtained with the manufacturing method of the present invention is protected, and various types of information are supplied in a visually recognizable manner on a flip-chip mounted semiconductor device that is manufactured using the semiconductor element.

The film for the backside of a semiconductor is preferably formed from a resin composition containing an epoxy resin and a phenol resin, and the total amount of the epoxy resin and the phenol resin is preferably 25 parts by weight or less to 100 parts by weight of the resin composition (the total components other than solvent, including resin, filler, and coloring agent).

The elastic modulus of the film for the backside of a flip-chip type semiconductor when the film is in an uncured state is preferably 10 MPa to 10 GPa, and more preferably 100 MPa to 5 GPa. By setting the elastic modulus to 10 GPa or less, the adhesion to the semiconductor wafer can be sufficiently ensured.

The film for the backside of a flip-chip type semiconductor preferably contains 0.01 parts by weight to 10 parts by weight of a coloring agent to 100 parts by weight of the resin composition (the total components other than solvent, including resin, filler, and coloring agent). By setting the content of the coloring agent to 0.01 parts by weight or more, the light transmittance can be made low, and the contrast of a marking portion to a portion other than the marking portion after laser marking can be made high. By setting the content of the coloring agent to 10 parts by weight or less, a good contrast can be effectively exhibited (expressed).

The present invention also relates to a flip-chip type semiconductor device that is obtained with the above-described manufacturing method.

Effect of the Invention

According to the method of manufacturing a flip-chip type semiconductor device of the present invention, a flip-chip type semiconductor device can be provided on which various types of information are supplied in a visually recognizable manner. A manufacturing method can be also provided in which the process is more simplified than a conventional manufacturing method.

MODE FOR CARRYING OUT THE INVENTION

Figure 1:
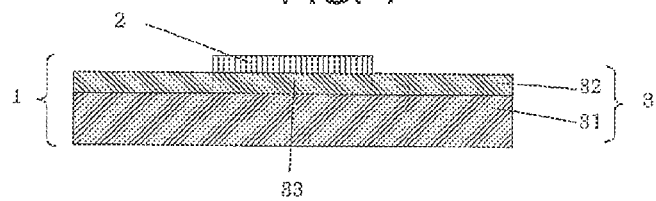
FIG. 1 is a cross-sectional schematic diagram showing one example of a dicing tape-integrated film for the backside of a semiconductor that can be used in the present invention, in which a film for the backside of a flip-chip type semiconductor is laminated onto a dicing tape.

The method of manufacturing a semiconductor device according to the present embodiment will be explained by referring to the drawings. However, the manufacturing method according to the present embodiment is not limited to these examples. FIG. 1 is a cross-sectional schematic diagram showing one example of a dicing tape-integrated film 1 for the backside of a semiconductor in which a film 2 for the backside of a flip-chip type semiconductor according to an embodiment of the present invention (below, also referred to as a film 2 for the backside of a semiconductor) is laminated onto a dicing tape 3. FIGS. 2(a) to 2(d) are cross-sectional schematic diagrams showing a method of manufacturing a semiconductor device in the case of using the dicing tape-integrated film 1 for the backside of a semiconductor. In the present description, parts that are unnecessary for the explanation are omitted in the drawings, and there are parts that are enlarged or reduced in the drawings to make the explanation easy.

The method of manufacturing a semiconductor device of the present invention includes: a step A of laminating on a semiconductor wafer a film for the backside of a flip-chip type semiconductor, in which the film is to be formed on the backside of a semiconductor element that is flip-chip connected onto an adherend; a step B of dicing the semiconductor wafer; and a step C of laser marking the film for the backside of a flip-chip type semiconductor. As the order of the steps A to C, the step A may be firstly performed, an order of the step A, the step B, and the step C may be performed, or an order of the step A, the step C, and the step B may be performed. The method may include steps other than the steps A to C, and the other steps will be described later. Each step will be explained in detail below.

(1) Step A

In the step A, the film 2 for the backside of a semiconductor is laminated to a semiconductor wafer 4. As will be described later, the film 2 for the backside of a semiconductor that is used in the present invention may be bonded to a semiconductor wafer alone. However, it is preferable that the film 2 is bonded to the semiconductor wafer 4 as the dicing tape-integrated film 1 for the backside of a semiconductor in which the film 2 is laminated onto the dicing tape 3 (FIG. 1). The laminating method in the case of using the dicing tape-integrated film 1 for the backside of a semiconductor as a preferred embodiment will be explained below.

Figure 2A:
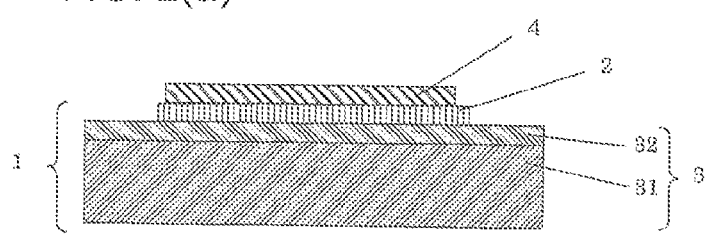
FIGS. 2(a) to 2(d) are cross-sectional schematic diagrams showing one example of the method of manufacturing a flip-chip type semiconductor device of the present invention.
Figure 2B:
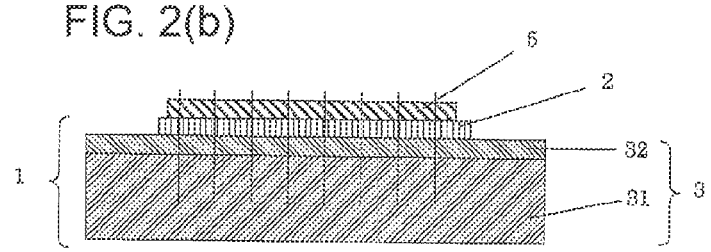
Figure 2C:
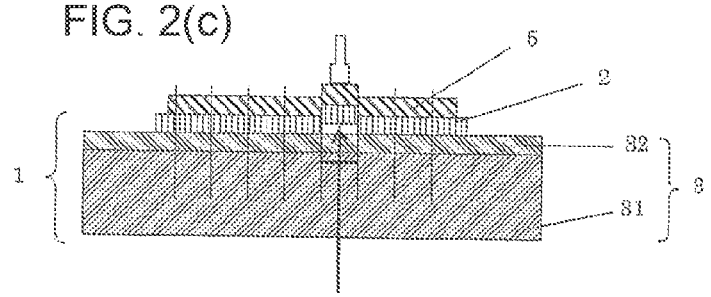
Figure 2D:
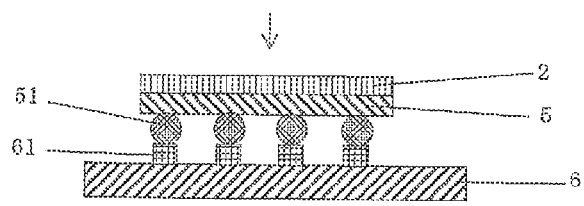

First, as shown in FIG. 2(a), a separator is appropriately peeled that is arbitrarily provided on the film 2 for the backside of a semiconductor of the dicing tape-integrated film 1 for the backside of a semiconductor, the semiconductor wafer 4 is bonded onto the film 2 for the backside of a semiconductor, and this is held by adhesion and fixed (a mounting step). At this time, the film 2 for the backside of a semiconductor is in an uncured state. The uncured state as used herein is the same as the state defined in the present description. The dicing tape-integrated film 1 for the backside of a semiconductor is bonded to the backside of the semiconductor wafer 4. The backside of the semiconductor wafer 4 means the surface opposite to the circuit forming surface (also referred to as a non-circuit surface, an electrode non-forming surface, etc.). The bonding method is not especially limited. However, a method using press bonding is preferable. The press bonding is performed normally by pressing with a pressing means such as a press roll. The film 2 for the backside of a semiconductor, etc. that are used in the step A will be explained in detail below.

(1-1) Film for Backside of Flip-Chip Type Semiconductor

The film 2 for the backside of a semiconductor that is used in the present invention has a film shape. In a conventionally known film for the backside of a semiconductor, it is necessary to cure the film for the backside of a semiconductor after bonding the film to a wafer. However, with the film 2 for the backside of a semiconductor that is used in the present invention, laser marking, peeling from a dicing tape, and a reflow step can be performed without curing the film 2 in advance.

The film 2 for the backside of a semiconductor can be formed from a resin composition, and can be constituted of a resin composition containing a thermoplastic resin and a thermosetting resin, a thermoplastic resin composition in which a thermosetting resin is not used, and a thermosetting resin composition in which a thermoplastic resin is not used.

Examples of the thermoplastic resin include a natural rubber, a butyl rubber, an isoprene rubber, a chloroprene rubber, an ethylene-vinyl acetate copolymer, an ethylene-acrylate copolymer, an ethylene-acrylic ester copolymer, a polybutadiene resin, a polycarbonate resin, a thermoplastic polyimide resin, polyamide resins such as 6-nylon and 6,6-nylon, a phenoxy resin, an acrylic resin, saturated polyester resins such as polyethylene terephthalate (PET) and polybutylene terephthalate (PBT), a polyamideimide resin, and a fluororesin. The thermoplastic resins can be used alone or two types or more can be used together. Of these thermoplastic resins, acrylic resin is particularly preferable since the resin contains ionic impurities in only a small amount and has a high heat resistance so as to make it possible to ensure the reliability of the semiconductor element.

The acrylic resin is not especially limited, and examples thereof include a polymer having one type or two types or more of acrylates or methacrylates having a linear or branched alkyl group having 30 carbon atoms or less (preferably 1 to 18 carbon atoms, further preferably 1 to 10 carbon atoms, and especially preferably 1 to 5 carbon atoms) as a component. That is, the acrylic resin of the present invention has a broad meaning and also includes a methacrylic resin. Examples of the alkyl group include a methyl group, an ethyl group, a propyl group, an isopropyl group, an n-butyl group, a t-butyl group, an isobutyl group, a pentyl group, an isopentyl group, a hexyl group, a heptyl group, a 2-ethylhexyl group, an octyl group, an isooctyl group, a nonyl group, an isononyl group, a decyl group, an isodecyl group, an undecyl group, a dodecyl group (a lauryl group), a tridecyl group, a tetradecyl group, a stearyl group, and an octadecyl group.

Other monomers for forming the acrylic resin are not especially limited as long as they are monomers other than acrylates or methacrylates having a linear or branched alkyl group having 30 carbon atoms or less. Examples thereof include carboxyl-containing monomers such as acrylic acid, methacrylic acid, carboxyethyl acrylate, carboxypentylacrylate, itaconic acid, maleic acid, fumaric acid, and crotonic acid; acid anhydride monomers such as maleic anhydride and itaconic anhydride; hydroxyl-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxymethylcyclohexyl) methylacrylate; monomers which contain a sulfonic acid group, such as styrenesulfonic acid, allylsulfonic acid, 2-(meth)acrylamide-2-methylpropanesulfonic acid, (meth)acrylamidepropane sulfonic acid, sulfopropyl (meth)acrylate, and (meth)acryloyloxynaphthalenesulfonic acid; and monomers which contain a phosphoric acid group, such as 2-hydroxyethylacryloyl phosphate. (Meth)acrylate refers to an acrylate and/or a methacrylate, and every "(meth)" in the description has the same meaning.

Examples of the thermosetting resin include an epoxy resin, a phenol resin, an amino resin, an unsaturated polyester resin, a polyurethane resin, a silicone resin, and a thermosetting polyimide resin. The thermosetting resins can be used alone or two types or more can be used together. An epoxy resin having a small amount of ionic impurities that erode the semiconductor element is especially suitable as the thermosetting resin. Further, a phenol resin can be suitably used as a curing agent for the epoxy resin.

The epoxy resin is not especially limited, and examples thereof include bifunctional epoxy resins and polyfunctional epoxy resins such as a bisphenol A type epoxy resin, a bisphenol F type epoxy resin, a bisphenol S type epoxy resin, a brominated bisphenol A type epoxy resin, a hydrogenated bisphenol A type epoxy resin, a bisphenol AF type epoxy resin, a bisphenyl type epoxy resin, a naphthalene type epoxy resin, a fluorene type epoxy resin, a phenol novolak type epoxy resin, an ortho-cresol novolak type epoxy resin, a trishydroxyphenylmethane type epoxy resin, and a tetraphenylolethane type epoxy resin, a hydantoin type epoxy resin, a trisglycidylisocyanurate type epoxy resin, and a glycidylamine type epoxy resin. Among the above-described epoxy resins, a novolak type epoxy resin, a biphenyl type epoxy resin, a trishydroxyphenylmethane type epoxy resin, and a tetraphenylolethane type epoxy resin are especially preferable. These epoxy resins are highly reactive with a phenol resin as a curing agent and are excellent in heat resistance.

The phenol resin acts as a curing agent for the epoxy resin, and examples thereof include novolak type phenol resins such as a phenol novolak resin, a phenol aralkyl resin, a cresol novolak resin, a tert-butylphenol novolak resin, and a nonylphenol novolak resin, a resol type phenol resin, and polyoxystyrenes such as polyparaoxystyrene. The phenol resins can be used alone or two types or more can be used together. Among these phenol resins, a phenol novolak resin and a phenol aralkyl resin are especially preferable because connection reliability of the semiconductor device can be improved.

The phenol resin is suitably compounded in the epoxy resin so that a hydroxyl group in the phenol resin to 1 equivalent of an epoxy group in the epoxy resin component becomes 0.5 to 2.0 equivalents. The ratio is more preferably 0.8 to 1.2 equivalents.

A thermal curing accelerating catalyst for an epoxy resin and a phenol resin may be used in the present invention. The thermal curing accelerating catalyst is not especially limited, and the catalyst can be appropriately selected from known thermal curing accelerating catalysts. The thermal curing accelerating catalysts can be used alone or two types or more can be used together. Examples of the thermal curing accelerating catalyst include an amine curing accelerator, a phosphorus curing accelerator, an imidazole curing accelerator, a boron curing accelerator and a phosphorus-boron curing accelerator.

The film 2 for the backside of a semiconductor is preferably formed from a resin composition containing an epoxy resin and a phenol resin, and more preferably formed from a resin composition containing an epoxy resin, a phenol resin, and an acrylic resin. Because the above-described resin composition has few ionic impurities and high heat resistance, the reliability of the semiconductor element can be ensured. For the compounding ratio of the resin composition containing an epoxy resin, a phenol resin, and an acrylic resin, the total amount of the epoxy resin and the phenol resin to 100 parts by weight of the acrylic resin is preferably 10 parts by weight to 100 parts by weight, and more preferably 10 parts by weight to 70 parts by weight. When the total amount of the epoxy resin and the phenol resin is within the above-described range, a change in physical properties is small before and after thermal curing. Therefore, laser marking of the film 2 for the backside of a semiconductor can be performed in the step C while the film 2 is in the uncured state.

The total amount of the epoxy resin and the phenol resin is preferably 25 parts by weight or less, and more preferably 10 parts by weight to 25 parts by weight to 100 parts by weight of the resin composition (the total components other than solvent, including resin, filler, and coloring agent). When the total amount of the epoxy resin and the phenol resin in the resin composition is within the above-described range, the elastic modulus at high temperatures becomes large, and a process with heat (for example, a laser marking process) can be performed without a curing step. The laser marking property (the visibility) becomes excellent. On the other hand, when the compounding ratio of the epoxy resin ratio becomes large, the elastic modulus at high temperatures becomes small. Therefore, it tends to be difficult to perform the process with heat before curing. When the total amount of the epoxy resin and the phenol resin exceeds 25 parts by weight, the laser-processed shape cannot be kept due to the reaction of the resin after the laser marking process (the process with heat), and the laser marking property (the visibility) tends to deteriorate. When the total amount of the epoxy resin and the phenol resin exceeds 25 parts by weight, it is not preferable because burrs tend to be generated by dicing.

It is important that the film 2 for backside of a semiconductor has tackiness (adhesion) with the backside (the surface where a circuit is not formed) of a semiconductor wafer 4.

The adhering strength (23° C., peeling angle 180°, peeling rate 300 mm/minute) of the film 2 for the backside of a semiconductor to the semiconductor wafer 4 is preferably 1 N/10 mm width or more, more preferably 2 N/10 mm width or more, and further preferably 4 N/10 mm width or more. The upper limit thereof is not especially limited. However, it is preferably 10 N/10 mm width or less, and more preferably 8 N/10 mm width or less. By setting the adhering strength to 1 N/10 mm width or more, the film can be bonded to the semiconductor wafer or the semiconductor element with excellent adhesion, and the occurrence of floating, etc. can be prevented. The occurrence of chip fly during dicing of the semiconductor wafer can be also prevented. The adhering strength of the film 2 for the backside of a semiconductor wafer to the semiconductor wafer is, for example, a value that is measured as follows.

<Adhering Strength>

A pressure-sensitive adhesive tape (trade name "BT315" manufactured by Nitto Denko Corporation) is bonded to one surface of the film 2 for the backside of a semiconductor to reinforce the backside. After that, the semiconductor wafer 4 having a thickness of 0.6 mm is bonded to the front surface of the film 2 for the backside of a semiconductor having a length of 150 mm and a width of 10 mm, a backside of which is reinforced, with a heat laminating method at 50° C. by moving a roller of 2 kg back and forth once. After that, the laminate is left to stand at rest on a hot plate (50° C.) for 2 minutes, and then at normal temperature (about 23° C.) for 20 minutes. Then, the film 2 for the reinforced backside of a semiconductor is peeled off at a temperature of 23° C. under the conditions of a peeling angle of 180° and a tensile rate of 300 mm/minute using a peeling tester (trade name "AUTO- GRAPH AGS-J" manufactured by Shimadzu Corporation). The adhering strength is a value (N/10 mm width) that is measured by peeling off the film for the backside of a semiconductor at the interface with the semiconductor wafer.

Further, a multifunctional compound that reacts with a functional group at the molecular chain end of a polymer, etc. is preferably added to the resin composition as a crosslinking agent. This makes it possible to enhance the adhesion characteristics under high temperatures, and to improve the heat resistance. The crosslinking agent is not especially limited, and a known crosslinking agent can be used. Specific examples thereof include an isocyanate crosslinking agent, an epoxy crosslinking agent, a melamine crosslinking agent, a peroxide crosslinking agent, a urea crosslinking agent, a metal alkoxide crosslinking agent, a metal chelate crosslinking agent, a metal salt crosslinking agent, a carbodiimide crosslinking agent, an oxazoline crosslinking agent, an aziridine crosslinking agent, and an amine crosslinking agent. An isocyanate crosslinking agent and an epoxy crosslinking agent are preferable. The crosslinking agents can be used alone or two types or more can be used together.

Examples of the isocyanate crosslinking agent include lower aliphatic polyisocyanates such as 1,2-ethylene diisocyanate, 1,4-butylene diisocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylene diisocyanate; and aromatic polyisocyanates such as 2,4-tolylene diisocyanate, 2,6-tolylene diisocyanate, 4,4'-diphenylmethane diisocyanate, and xylylene diisocyanate. A trimethylolpropane/tolylene diisocyanate trimer adduct (trade name: Coronate L manufactured by Nippon Polyurethane Industry Co., Ltd.) and a trimethylolpropane/hexamethylene diisocyanate trimer adduct (trade name: Coronate HL manufactured by Nippon Polyurethane Industry Co., Ltd.) can also be used.

Examples of the epoxy crosslinking agent include N,N,N', N'-tetraglycidyl-m-xylenediamine, diglycidylaniline, 1,3-bis (N,N-glycidylaminomethyl)cyclohexane, 1,6-hexanediol diglycidylether, neopentylglycol diglycidylether, ethyleneglycol diglycidylether, propyleneglycol diglycidylether, polyethyleneglycol diglycidylether, polypropyleneglycol diglycidylether, sorbitol polyglycidylether, glycerol polyglycidylether, pentaerythritol polyglycidylether, polyglycerol polyglycidylether, sorbitan polyglycidylether, trimethylolpropane polyglycidylether, diglycidyl adipate, diglycidyl o-phthalate, triglycidyl-tris(2-hydroxyethyl) isocyanurate, resorcin diglycidylether, bisphenol-S-diglycidyl ether, and an epoxy resin having two or more epoxy groups in the molecule.

The amount of the crosslinking agent used is not especially limited, and can be appropriately selected according to the level of crosslinking. Specifically, the amount of the crosslinking agent used is normally preferably 7 parts by weight or less, more preferably 0.05 to 7 parts by weight, to 100 parts by weight of a polymer component (especially, a polymer having a functional group at the end of the molecular chain) for example. It is not preferable when the amount of the crosslinking agent used is more than 7 parts by weight to 100 parts by weight of the polymer component because the adhering strength decreases. From the viewpoint of improving cohesive strength, the amount of the crosslinking agent used is preferably 0.05 parts by weight or more to 100 parts by weight of the polymer component.

In the present invention, it is possible to perform a crosslinking treatment by irradiation with an electron beam, an ultraviolet ray, or the like in place of using the crosslinking agent or together with a crosslinking agent.

The film 2 for the backside of a semiconductor is preferably colored. With this configuration, the film for the backside of a semiconductor can exhibit an excellent marking property and an excellent appearance, and a semiconductor device can be obtained having an appearance with added value. Because the colored film 2 for the backside of a semiconductor has an excellent marking property, various information such as character information and graphic information can be supplied on a semiconductor device or the surface where a circuit is not formed of the semiconductor device in which the semiconductor element is marked through the film 2 for the backside of a semiconductor using various marking methods such as a printing method and a laser marking method. Especially, the information such as character information and graphic information that is supplied by marking can be recognized visually with excellent visibility by controlling the color. In a case where the film 2 for the backside of a semiconductor is colored as described above, it is preferable because the dicing tape and the film 2 for the backside of a semiconductor can be easily distinguished from each other, and the workability, etc. can be improved. Further, it is possible to color-code the semiconductor device by product, for example. When the film 2 for the backside of a semiconductor is colored (when it is not colorless or transparent), the color is not especially limited. However, the color is preferably a dark color such as black, blue, or red, and black is especially preferable.

In this embodiment, the dark color means a dark color having $L^*$ that is defined in the $L^*a^*b^*$ color system of basically 60 or less (0 to 60), preferably 50 or less (0 to 50), and more preferably 40 or less (0 to 40).

The black color means a blackish color having $L^*$ that is defined in the $L^*a^*b^*$ color system of basically 35 or less (0 to 35), preferably 30 or less (0 to 30) and more preferably 25 or less (0 to 25). In the black color, each of $a^*$ and $b^*$ that is defined in the $L^*a^*b^*$ color system can be appropriately selected according to the value of $L^*$. For example, both of $a^*$ and $b^*$ are preferably −10 to 10, more preferably −5 to 5, and especially preferably −3 to 3 (above all, 0 or almost 0).

In this embodiment, $L^*$, $a^*$, and $b^*$ that are defined in the $L^*a^*b^*$ color system can be obtained by measurement using a colorimeter (trade name: CR-200 manufactured by Konica Minolta Holdings, Inc.). The $L^*a^*b^*$ color system is a color space that is endorsed by Commission Internationale de l'Éclairage (CIE) in 1976, and means a color space that is called the CIE 1976 ($L^*a^*b^*$) color system. The $L^*a^*b^*$ color system is provided in JIS Z 8729 in the Japanese Industrial Standards.

When coloring the film 2 for the backside of a semiconductor, a coloring material (coloring agent) can be used according to the objective color. Various dark color materials such as black color materials, blue color materials, and red color materials can be suitably used, and especially the black color materials are suitable. The color materials may be any of pigments, dyes, and the like. The color materials can be used alone or two types or more can be used together. Any dyes such as acid dyes, reactive dyes, direct dyes, dispersive dyes, and cationic dyes can be used. The pigments are also not especially limited in the form, and may be appropriately selected from known pigments.

When dyes are used as the color materials, the film 2 for the backside of a semiconductor (consequently a dicing tape-integrated film for the backside of a semiconductor) having uniform or almost uniform coloring concentration can be easily manufactured because the dyes disperse uniformly or almost uniformly due to dissolution in the film for the backside of a semiconductor. Because of that, when the dyes are used as the color materials, the coloring concentration of the film 2 for the backside of a semiconductor in the dicing tape-integrated film for the backside of a semiconductor can be made uniform or almost uniform, and the marking property and the appearance can be improved.

The black color material is not especially limited, and can be appropriately selected from inorganic black pigments and black dyes, for example. The black color material may be a color material mixture in which a cyan color material (blue-green color material), a magenta color material (red-purple color material), and a yellow color material are mixed together. The black color materials can be used alone or two types or more can be used together. The black color materials can be used also with other color materials other than black.

Specific examples of the black color materials include carbon black such as furnace black, channel black, acetylene black, thermal black, and lamp black, graphite (black lead), copper oxide, manganese dioxide, azo pigments such as azomethine azo black, aniline black, perylene black, titanium black, cyanine black, activated carbon, ferrite such as non-magnetic ferrite and magnetic ferrite, magnetite, chromium oxide, iron oxide, molybdenum disulfide, chromium complex, complex oxide black, and anthraquinone organic black.

In the present invention, black dyes such as C. I. solvent black 3, 7, 22, 27, 29, 34, 43, and 70, C. I. direct black 17, 19, 22, 32, 38, 51, and 71, C. I. acid black 1, 2, 24, 26, 31, 48, 52, 107, 109, 110, 119, and 154, and C. I. disperse black 1, 3, 10, and 24; and black pigments such as C. I. pigment black 1 and 7 can be used as the black color material.

Examples of such black color materials that are available on the market include Oil Black BY, Oil Black BS, Oil Black HBB, Oil Black 803, Oil Black 860, Oil Black 5970, Oil Black 5906, and Oil Black 5905 manufactured by Orient Chemical Industries Co., Ltd.

Examples of color materials other than the black color materials include a cyan color material, a magenta color material, and a yellow color material. Examples of the cyan color material include cyan dyes such as C. I. solvent blue 25, 36, 60, 70, 93, and 95; and C. I. acid blue 6 and 45; and cyan pigments such as C. I. pigment blue 1, 2, 3, 15, 15:1, 15:2, 15:3, 15:4, 15:5, 15:6, 16, 17, 17:1, 18, 22, 25, 56, 60, 63, 65, and 66; C. I. vat blue 4 and 60; and C. I. pigment green 7.

Examples of the magenta color material include magenta dyes such as C. I. solvent red 1, 3, 8, 23, 24, 25, 27, 30, 49, 52, 58, 63, 81, 82, 83, 84, 100, 109, 111, 121, and 122; C. I. disperse red 9; C. I. solvent violet 8, 13, 14, 21, and 27; C. I. disperse violet 1; C. I. basic red 1, 2, 9, 12, 13, 14, 15, 17, 18, 22, 23, 24, 27, 29, 32, 34, 35, 36, 37, 38, 39, and 40; and C. I. basic violet 1, 3, 7, 10, 14, 15, 21, 25, 26, 27, and 28.

Examples of the magenta color material include magenta pigments such as C. I. pigment red 1, 2, 3, 4, 5, 6, 7, 8, 9, 10, 11, 12, 13, 14, 15, 16, 17, 18, 19, 21, 22, 23, 30, 31, 32, 37, 38, 39, 40, 41, 42, 48:1, 48:2, 48:3, 48:4, 49, 49:1, 50, 51, 52, 52:2, 53:1, 54, 55, 56, 57:1, 58, 60, 60:1, 63, 63:1, 63:2, 64, 64:1, 67, 68, 81, 83, 87, 88, 89, 90, 92, 101, 104, 105, 106, 108, 112, 114, 122, 123, 139, 144, 146, 147, 149, 150, 151, 163, 166, 168, 170, 171, 172, 175, 176, 177, 178, 179, 184, 185, 187, 190, 193, 202, 206, 207, 209, 219, 222, 224, 238, and 245; C. I. pigment violet 3, 9, 19, 23, 31, 32, 33, 36, 38, 43, and 50; and C. I. vat red 1, 2, 10, 13, 15, 23, 29, and 35.

Examples of the yellow color material include yellow dyes such as C. I. solvent yellow 19, 44, 77, 79, 81, 82, 93, 98, 103, 104, 112, and 162; and yellow pigments such as C. I. pigment orange 31 and 43; C. I. pigment yellow 1, 2, 3, 4, 5, 6, 7, 10, 11, 12, 13, 14, 15, 16, 17, 23, 24, 34, 35, 37, 42, 53, 55, 65, 73, 74, 75, 81, 83, 93, 94, 95, 97, 98, 100, 101, 104, 108, 109, 110, 113, 114, 116, 117, 120, 128, 129, 133, 138, 139, 147, 150, 151, 153, 154, 155, 156, 167, 172, 173, 180, 185, and 195, and C. I. vat yellow 1, 3, and 20.

Various color materials such as cyan color materials, magenta color materials, and yellow color materials can be used alone or two types or more can be used together. When two types or more of various color materials such as cyan color materials, magenta color materials, and yellow color materials are used, the mixing ratio or the compounding ratio of these color materials is not especially limited, and can be appropriately selected according to the types of each color material and the intended color.

The content of the coloring agent is preferably 0.01 parts by weight to 10 parts by weight, more preferably 0.5 parts by weight to 8 parts by weight, and further preferably 1 part by weight to 5 parts by weight to 100 parts by weight of the resin composition (the total components other than solvent, including resin, filler, and coloring agent). By setting the content to 0.01 parts by weight or more, the light transmittance can be made low, and the contrast can be made high of a marking portion to a portion other than the marking portion after laser marking. The film 2 for the backside of a semiconductor may be a single layer or may be a laminated layer in which a plurality of layers are laminated. However, in the case of a laminated film, the content of the coloring agent may be within a range of 0.01 parts by weight to 10 parts by weight as the entire laminated film.

When coloring the film 2 for the backside of a semiconductor, the colored state of the layers is not especially limited. For example, the film 2 for the backside of a semiconductor may be a single layered film in which the coloring agent is added. It may also be a laminated film in which at least a resin layer formed at least of a thermosetting resin and a coloring agent layer are laminated. When the film 2 for the backside of a semiconductor is in the form of a laminated film of the resin layer and the coloring agent layer, the film 2 for the backside of a semiconductor preferably has a laminated state of a resin layer/a coloring agent layer/a resin layer. In this case, the two resin layers on both sides of the coloring agent layer may be resin layers having the same composition or may be resin layers having different compositions.

The tensile storage modulus at 23° C. of the uncured film 2 for the backside of a semiconductor used in the present invention is preferably 10 MPa to 10 GPa, more preferably 100 MPa to 5 GPa, even more preferably 100 MPa to 3 GPa, still more preferably 100 MPa to 1 GPa, and especially preferably 100 MPa to 0.7 GPa. By setting the elastic modulus to 10 GPa or less, the adhesion to the semiconductor wafer can be sufficiently ensured.

The film 2 for the backside of a semiconductor may be of a single layer or may be a laminated film in which a plurality of layers are laminated. However, when the film for the backside of a semiconductor is a laminated film, the tensile storage modulus of the uncured film at 23° C. may be within the range as a whole laminated film. The tensile storage modulus (23° C.) in the uncured portion of the film for the backside of a semiconductor can be controlled by the type and the content of the resin component (a thermoplastic resin and a thermosetting resin), the type and the content of the filler such as a silica filler, and the like.

The uncured film 2 for the backside of a semiconductor was produced without laminating the films on the dicing tape 3, and the tensile storage modulus was measured using a dynamic viscoelasticity measurement apparatus (Solid Analyzer RS A2) manufactured by Rheometric Scientific FE, Ltd. in tensile mode, sample width 10 mm, sample length 22.5 mm, sample thickness 0.2 mm, frequency 1 Hz, temperature rise rate 10° C./min, under a nitrogen atmosphere, and at a prescribed temperature (23° C.).

The elastic modulus after curing of the film 2 for the backside of a semiconductor that is used in the present invention is preferably 10 MPa to 10 GPa, more preferably 100 MPa to 5 GPa, further preferably 100 MPa to 3 GPa, and especially preferably 100 MPa to 1 GPa. In the method of measuring the elastic modulus, the elastic modulus is measured in the same manner as in the above-described measuring method except the film 2 for the backside of a semiconductor is cured (at 175° C. for 1 hour).

The film 2 for the backside of a semiconductor that is used in the present invention has a light transmittance at a wavelength of 532 nm or 1064 nm of preferably 20% or less, more preferably 15% or less, and further preferably 10% or less. The lower limit of the light transmittance is not especially limited, and should be 0% or more. When the light transmittance at a wavelength of 532 nm or 1064 nm is 20% or less, the processability by laser beam irradiation becomes excellent. When the light transmittance at a wavelength of 532 nm or 1064 nm is 20% or less, the laser beam is hardly transmitted. Therefore, the semiconductor element (especially, the backside of the semiconductor element) is less likely exposed to the laser beam. As a result, an adverse effect on the semiconductor element can be effectively prevented, and the production yield can be improved. The film 2 for the backside of a semiconductor may be a single layer or may be a laminated layer in which a plurality of layers are laminated. However, in the case of a laminated film, the light transmittance may be within a range of 0% to 20% as the entire laminated film. The light transmittance (%) of the film 2 for the backside of a semiconductor can be determined with the following method.

<Light Transmittance>

(1) A film for the backside of a semiconductor having a thickness (an average thickness: 20 µm) is produced without laminating the film to a dicing tape.

(2) The film for the backside of a semiconductor is irradiated with a light beam having wavelength of 300 nm to 1100 nm [apparatus: a visual light generator (trade name "ABSORPTION SPECTRO PHOTOMETER") manufactured by Shimadzu Corporation] at a prescribed intensity.

(3) The intensities of the transmitted light beams having wavelengths of 532 nm and 1064 nm are measured using a spectrophotometer (a spectrophotometer "ABSORPTION SPECTRO PHOTOMETER UV-2550" manufactured by Shimadzu Corporation).

(4) The light transmittances (%) of wavelengths 532 nm and 1064 nm are determined from a change in intensities before and after the transmission of the light beams having wavelengths of 532 nm and 1064 nm to the film for the backside of a semiconductor.

The above-described method of calculating the light transmittance (%) can be applied also to the calculation of the light transmittance (%) of a film for the backside of a semiconductor not having a thickness of 20 µm. Specifically, an absorbance $A_{20}$ at a thickness of 20 µm can be calculated as follows according to the Lambert-Beer's law $$A_{20} = \alpha \times L_{20} \times C \quad (1)$$

(wherein $L_{20}$ represents an optical path length, $\alpha$ represents an absorption coefficient, and C represents a sample concentration)

An absorbance $A_x$ at a thickness of X (µm) can be represented by the following equation (2).

$$A_x = \alpha \times L_x \times C \quad (2)$$

The absorbance $A_{20}$ at a thickness of 20 (µm) can be also represented by the following equation (3).

$$A_{20} = -\log_{10} T_{20} \quad (3)$$

(wherein, $T_{20}$ represents the light transmittance at a thickness of 20 µm)

From the equations (1) to (3), the absorbance $A_x$ can be represented as:

$$A_x = A_{20} \times (L_x/L_{20})$$

$$= -[\log_{10}(T_{20})] \times (L_x/L_{20})$$

With this, a light transmittance $T_x$ (%) at a thickness of X (µm) can be calculated from the following equation.

$$T_x = 10^{-Ax},$$

wherein $Ax = -[\log_{10}(T_{20})] \times (L_x/L_{20})$

In regard to setting the thickness of the film for the backside of a semiconductor in the method of calculating the light transmittance (%) to 20 µm, it does not particularly intend to limit the thickness of the film 2 for the backside of a semiconductor that is used in the present invention. It is a thickness that is adopted during measurement for convenience.

The light transmittance (%) of the film 2 for the backside of a semiconductor can be controlled by the type and content of the resin components, the type and content of the coloring agents (such as a pigment and a dye), the content of an inorganic filler, etc.

In the film 2 for the backside of a semiconductor, the contrast of a marking portion to a portion other than the marking portion after laser marking is preferably 20% or more. The lower limit of the contrast is more preferably 25%, and further preferably 30%. The larger the contrast is, the better it is. However, examples of the upper limit thereof include 250%, 200%, 150%, 100%, and 60%. In the film 2 for the backside of a semiconductor, the contrast of a marking portion to a portion other than the marking portion after laser marking is 20% or more, and the contrast is excellent. Therefore, the visibility of various types of information (for example, character information and graphic information) that are supplied by laser marking is good.

The brightness of a marking portion and a portion other than the marking portion (a non-marking portion) of the film for the backside of a semiconductor is measured with a CV-5000 manufactured by Keyence Corporation, and then the contrast can be determined by the following equation.

Contrast(%)={[(Brightness of marking portion)−(Brightness of non-marking portion)]/(Brightness of marking portion)}×100    [Math 1]

The film 2 for the backside of a semiconductor may be a single layer or may be a laminated layer in which a plurality of layers are laminated. However, in the case of a laminated film, the contrast is preferably within a range of 20% or more for the entire laminated film.

Other additives can be appropriately compounded in the film 2 for the backside of a semiconductor as necessary. Examples of the other additives include a filler, a flame retardant, a silane coupling agent, an ion trapping agent, an extender, an anti-aging agent, an antioxidant, and a surfactant.

The filler may be any of an inorganic filler and an organic filler. However, an inorganic filler is preferable. By adding a filler such as an inorganic filler, electric conductivity can be imparted to the film 2 for the backside of a semiconductor, heat conductivity can be improved, and the elastic modulus can be adjusted. The film 2 for the backside of a semiconductor may be electrically conductive or non-conductive. Examples of the inorganic filler include ceramics such as silica, clay, gypsum, calcium carbonate, barium sulfate, alumina oxide, beryllium oxide, silicon carbide, and silicon nitride, metals such as aluminum, copper, silver, gold, nickel, chromium, lead, tin, zinc, palladium, and solder, alloys, and various inorganic powders consisting of carbon. The fillers may be used alone or two types or more can be used together. Among these, silica, especially molten silica, is preferable. The average particle size of the inorganic filler is preferably in a range of 0.1 to 80 µm. The average particle size of the inorganic filler can be measured with a laser diffraction type particle size distribution device, for example.

The compounding amount of the filler is preferably 80 parts by weight or less, and especially preferably 0 to 75 parts by weight to 100 parts by weight of the organic resin component.

Examples of the flame retardant include antimony trioxide, antimony pentoxide, and a brominated epoxy resin. These can be used alone or two types or more can be used together. Examples of the silane coupling agent include β-(3,4-epoxy-cyclohexyl)ethyltrimethoxysilane, γ-glycidoxypropyltrimethoxysilane, and γ-glycidoxypropylmethyldiethoxysilane. These compounds can be used alone or two types or more can be used together. Examples of the ion trap agent include hydrotalcites and bismuth hydroxide. These can be used alone or two types or more can be used together.

The film 2 for the backside of a semiconductor can be formed by a common method of mixing a thermosetting resin such as an epoxy resin, optionally a thermoplastic resin such as an acrylic resin, and optionally a solvent, other additives, and the like to prepare a resin composition and forming the composition into a film layer. Specifically, a film layer (an adhesive layer) as the film 2 for the backside of a semiconductor can be formed by a method of applying the resin composition onto the pressure-sensitive adhesive layer 32 of the dicing tape, a method of applying the resin composition onto an appropriate separator such as release paper to form a resin layer (or an adhesive layer) and transcribing (transferring) the resin layer onto the pressure-sensitive adhesive layer 32, or the like. The resin composition may be a solution or a dispersion liquid.

The thermosetting resin of the film 2 for the backside of a semiconductor is in an uncured state at a stage before applying the film to the semiconductor wafer. The uncured state used herein is the same as the state defined in the present description.

The gel fraction of the film 2 for the backside of a semiconductor is not especially limited, and can be appropriately selected from a range of 50% by weight or less, preferably 0 to 30% by weight, and especially preferably 0 to 10% by weight. The gel fraction of the film 2 for the backside of a semiconductor can be measured by the following method.

<Method of Measuring Gel Fraction>

About 0.1 g of a sample (sample weight) is precisely weighed from the film 2 for the backside of a semiconductor, the sample is wrapped with a mesh sheet, and then the sample is immersed in about 50 mL of toluene at room temperature for a week. After that, the portion insoluble in the solvent (content of the mesh sheet) is taken out of toluene and dried at 130° C. for about 2 hours, and after drying, the portion insoluble in the solvent is weighed (weight after immersion and drying), and the gel fraction (% by weight) is calculated from the following formula.

$$\text{Gel fraction(\% by weight)}=[(\text{Weight after immersion and drying})/(\text{Sample weight})]\times 100 \qquad [\text{Math 2}]$$

The gel fraction of the film 2 for the backside of a semiconductor can be controlled by the type and the content of the resin component, the type and the content of the crosslinking agent, the heating temperature, the heating time, and the like.

When the film 2 for the backside of a semiconductor in the present invention is a film that is formed with a resin composition containing a thermosetting resin such as an epoxy resin, adhesion to a semiconductor wafer can be exhibited effectively.

Because cutting water is used in the dicing step of the semiconductor wafer, the film 2 for the backside of a semiconductor may absorb moisture and the water content may exceed the normal value. When flip-chip bonding is performed with such a high water content, water vapor is accumulated in the boundary between the film 2 for the backside of a semiconductor and a semiconductor wafer or a processed body thereof (a semiconductor), and floating may occur. Therefore, to avoid such a problem, the film 2 for the backside of a semiconductor is made to have a configuration in which a core material having high moisture permeability is provided on both surfaces thereof to diffuse water vapor. From such a viewpoint, a multilayered structure in which films for the backside of a semiconductor are formed on one surface or both surfaces of the core material may be used as the film for the backside of a semiconductor. Examples of the core material include a film such as a polyimide film, a polyester film, a polyethylene terephthalate film, a polyethylene naphthalate film, or a polycarbonate film, a resin substrate reinforced by a glass fiber or a plastic nonwoven fiber, a silicon substrate, or a glass substrate.

The thickness (total thickness in the case of a laminated film) of the film 2 for the backside of a semiconductor is not especially limited. However, the thickness can be appropriately selected from a range of about 2 to 200 µm. The thickness is preferably about 4 to 160 µm, more preferably about 6 to 100 µm, and especially preferably about 10 to 80 µm.

At least one of the surfaces of the film 2 for the backside of a semiconductor is preferably protected by a separator (a release liner, not shown in the drawings). In a case of a dicing tape-integrated film 1 for the backside of a semiconductor, the separator may be provided only on one surface of the film for the backside of a semiconductor. On the other hand, in the case of a film for the backside of a semiconductor that is not integrated with the dicing tape, the separator may be provided on one surface or both surfaces of the film for the backside of a semiconductor. The separator has a function of protecting the film for the backside of a semiconductor as a protective material until the film is used. In the case of the dicing tape-integrated film 1 for the backside of a semiconductor, the separator can be further used as a support base when transferring the film 2 for the backside of a semiconductor to the pressure-sensitive adhesive layer 32 on the base of the dicing tape. The separator is peeled when pasting the semiconductor wafer onto the film for the backside of a semiconductor. Examples of the separator include polyethylene, polypropylene, a plastic film such as polyethylene terephthalate with a surface coated with a release agent such as a fluorine release agent or a long chain alkylacrylate release agent, and paper. The separator can be formed by a conventionally known method. The thickness of the separator is also not especially limited.

When the film 2 for the backside of a semiconductor is not laminated on the dicing tape 3, the film 2 for the backside of a semiconductor may be protected by the separator having a release layer on both surfaces in a form of being wound up in a roll using one sheet of the separator, or may be protected by a separator having a release layer on at least on one of the surfaces.

The coefficient of moisture absorption of the film 2 for the backside of a semiconductor is preferably low. Specifically, the coefficient of moisture absorption is preferably 1% by weight or less, and more preferably 0.8% by weight or less. By making the coefficient of moisture absorption 1% by weight or less, the laser marking property can be improved. Further, generation of voids between the film 2 for the backside of a semiconductor and the semiconductor element can be suppressed or prevented in a reflow step, for example. The coefficient of moisture absorption is a value calculated from the weight change before and after the film 2 for the backside of a semiconductor are left under an atmosphere of a temperature of 85° C. and a relative humidity of 85% RH for 168 hours. When the film 2 for the backside of a semiconductor is formed of a resin composition containing a thermosetting resin, the coefficient of moisture absorption is a value obtained when the films for the backside of a semiconductor after thermal curing are left under an atmosphere of a temperature of 85° C. and a relative humidity of 85% RH for 168 hours. The coefficient of moisture absorption can be adjusted by changing the added amount of the inorganic filler, for example.

The ratio of the volatile component of the film 2 for the backside of a semiconductor is preferably small. Specifically, the weight decrease rate (ratio of the weight decrease amount) of the film 2 for the backside of a semiconductor after a heat treatment is preferably 1% by weight or less, and more preferably 0.8% by weight or less. The condition of the heating treatment is a heating temperature of 250° C. and a heating time of 1 hour, for example. By making the weight decrease rate 1% by weight or less, the laser marking property can be improved. The generation of cracks in the flip-chip type semiconductor device can be suppressed or prevented in a reflow step, for example. The weight decrease rate can be adjusted by adding an inorganic substance that can decrease the generation of cracks during a lead-free solder reflow, for example. When the film 2 for the backside of a semiconductor is formed with a resin composition containing a thermosetting resin, the weight decrease rate means a value obtained when the film for the backside of a semiconductor after thermal curing is heated under conditions of a heating temperature of 250° C. and a heating time of 1 hour.

In the present invention, the dicing tape-integrated film 1 for the backside of a semiconductor is preferably used as described above. However, in the case where the film 2 for the backside of a semiconductor is used without integrating with a dicing tape, a semiconductor device can be manufactured in accordance with the method of manufacturing a semiconductor device in which the dicing tape-integrated film 1 for the backside of a semiconductor is used. The method of manufacturing a semiconductor device using the film 2 for the backside of a semiconductor is a manufacturing method having a step of bonding the film for the backside of a semiconductor and the dicing tape in such a manner that the film for the backside of a semiconductor contacts a pressure-sensitive adhesive layer of the dicing tape in addition to the steps of the method of manufacturing the dicing tape-integrated film for the backside of a semiconductor.

The film 2 for the backside of a semiconductor can be used by pasting the semiconductor wafer to an individual semiconductor chip. In this case, the method of manufacturing a semiconductor device using the film 2 for the backside of a semiconductor may include at least a step of pasting a dicing tape to a semiconductor wafer, a step of dicing the semiconductor wafer, a step of picking up the semiconductor element that is obtained by dicing, a step of flip-chip connecting the semiconductor element to an adherend, and a step of pasting a film for the backside of a semiconductor to the semiconductor element.

(1-2) Dicing Tape

The dicing tape 3 has a configuration in which the pressure-sensitive adhesive 32 is formed on the base 31.

The base (support base) can be used as a support base body of the pressure-sensitive adhesive layer, and the like. The base 31 preferably has radiation transparency. Examples of the base 31 include appropriate thin materials including paper bases such as paper; fiber bases such as cloth, unwoven cloth, felt, and net; metal bases such as a metal foil and a metal plate; plastic bases such as a plastic film and sheet; rubber bases such as a rubber sheet; foams such as a foamed sheet, and laminated bodies of these (especially laminated bodies of a plastic base and other bases and laminated bodies of plastic films or sheets). Among these, the plastic bases such as a plastic film and sheet can be suitably used as the base.

Examples of the material of such a plastic base include olefin resins such as polyethylene (PE), polypropylene (PP), and an ethylene-propylene copolymer; copolymers having ethylene as a monomer component such as a ethylene vinyl acetate copolymer (EVA), an ionomer resin, an ethylene-(meth)acrylate copolymer, and an ethylene-(meth)acrylate (random, alternating) copolymer; polyesters such as polyethylene terephthalate (PET), polyethylene naphthalate (PEN), and polybutylene terephthalate (PBT); an acrylic resin; polyvinyl chloride (PVC); polyurethane; polycarbonate; polyphenylene sulfide (PPS); amide resins such as polyamide (nylon) and fully aromatic polyamide (aramid); polyether ether ketone (PEEK); polyimide; polyetherimide; polyvinylidene chloride; ABS (acrylonitrile-butadiene-styrene copolymer); a cellulose resin; a silicone resin; and a fluororesin.

Further, the material of the base 31 includes a cross-linked body of the above resins. The above plastic film may be also used unstreched, or one may be also used on which a monoaxial or a biaxial stretching treatment is performed depending on necessity. According to resin sheets in which heat shrinkable properties are imparted by the stretching treatment, etc., the adhesive area of the pressure-sensitive adhesive layer 32 and the film 2 for the backside of a semiconductor are reduced by thermally shrinking the base 31 after dicing, and the recovery of the semiconductor chips can be facilitated.

A known surface treatment such as a chemical or physical treatment such as a chromate treatment, ozone exposure, flame exposure, high voltage electric exposure, and an ionized ultraviolet treatment, and a coating treatment with an undercoating agent (for example, a tacky substance described later) can be performed on the surface of the base 31 in order to improve adhesiveness, holding properties, etc. with the adjacent layer.

The same type or different types can be appropriately selected and used as the base 31, and several types can be blended and used as necessary. A vapor deposited layer of a conductive substance having a thickness of about 30 to 500 Å consisting of metals, alloys, and oxides of these can be provided on the base 31 to impart an antistatic function to the base 31. The base 31 may be a single layer or a multilayer consisting of two types or more layers.

The thickness of the base 31 (total thickness in the case of a laminated body) is not especially limited, and can be appropriately selected according to the strength, flexibility, purpose of use, and the like. For example, the thickness is generally 1000 μm or less, preferably 1 to 1000 μm, more preferably 10 to 500 µm, still more preferably 20 to 300 µm, and especially preferably about 30 to 200 µm.

The base 31 may contain various additives such as a coloring agent, a filler, a plasticizer, an anti-aging agent, an antioxidant, a surfactant, and a flame retardant as long as the effects of the present invention are not deteriorated.

The pressure-sensitive adhesive layer 32 is formed with a pressure-sensitive adhesive, and has adherability. The pressure-sensitive adhesive is not especially limited, and can be appropriately selected among known pressure-sensitive adhesives. Specifically, known pressure-sensitive adhesives (refer to Japanese Patent Application Laid-Open Nos. 56-61468, 61-174857, 63-17981, and 56-13040, for example) such as a pressure-sensitive adhesive having the above-described characteristics can be appropriately selected from an acrylic pressure-sensitive adhesive, a rubber pressure-sensitive adhesive, a vinylalkylether pressure-sensitive adhesive, a silicone pressure-sensitive adhesive, a polyester pressure-sensitive adhesive, a polyamide pressure-sensitive adhesive, a urethane pressure-sensitive adhesive, a fluorine pressure-sensitive adhesive, a styrene-diene block copolymer pressure-sensitive adhesive, and a creep property improved pressure-sensitive adhesive in which a hot-melt resin having a melting point of about 200° C. or less is compounded in these pressure-sensitive adhesives. A radiation curing type pressure-sensitive adhesive (or an energy ray curing type pressure-sensitive adhesive) and a thermally expandable pressure-sensitive adhesive can also be used as the pressure-sensitive adhesive. The pressure-sensitive adhesives can be used alone or two types or more can be used together.

An acrylic pressure-sensitive adhesive and a rubber pressure-sensitive adhesive can be suitably used as the pressure-sensitive adhesive, and especially an acrylic pressure-sensitive adhesive is suitable. An example of the acrylic pressure-sensitive adhesive is an acrylic pressure-sensitive adhesive having an acrylic polymer, in which one type or two types or more of alkyl (meth)acrylates are used as a monomer component, as a base polymer.

Examples of alkyl (meth)acrylates in the acrylic pressure-sensitive adhesive include methyl (meth)acrylate, ethyl (meth)acrylate, propyl (meth)acrylate, isopropyl (meth)acrylate, butyl (meth)acrylate, isobutyl (meth)acrylate, s-butyl (meth)acrylate, t-butyl (meth)acrylate, pentyl (meth)acrylate, hexyl (meth)acrylate, heptyl (meth)acrylate, octyl (meth) acrylate, 2-ethylhexyl (meth)acrylate, isooctyl (meth)acrylate, nonyl (meth)acrylate, isononyl (meth)acrylate, decyl (meth)acrylate, isodecyl (meth)acrylate, undecyl (meth)acrylate, dodecyl (meth)acrylate, tridecyl (meth)acrylate, tetradecyl (meth)acrylate, pentadecyl (meth)acrylate, hexadecyl (meth)acrylate, heptadecyl (meth)acrylate, octadecyl (meth) acrylate, nonadecyl (meth)acrylate, and eicosyl (meth)acrylate. Alkyl (meth)acrylates having an alkyl group of 4 to 18 carbon atoms are suitable. The alkyl group of alkyl (meth) acrylates may be any of linear or branched chain.

The acrylic polymer may contain units that correspond to other monomer components that are copolymerizable with alkyl (meth)acrylates described above (copolymerizable monomer component) for reforming cohesive strength, heat resistance, and crosslinking property, as necessary. Examples of such copolymerizable monomer components include carboxyl group-containing monomers such as (meth)acrylic acid (acrylic acid, methacrylic acid), carboxyethyl acrylate, carboxypentylacrylate, itaconic acid, maleic acid, fumaric acid, and crotonic acid; acid anhydride group-containing monomers such as maleic anhydride and itaconic anhydride; hydroxyl group-containing monomers such as hydroxyethyl (meth)acrylate, hydroxypropyl (meth)acrylate, hydroxybutyl (meth)acrylate, hydroxyhexyl (meth)acrylate, hydroxyoctyl (meth)acrylate, hydroxydecyl (meth)acrylate, hydroxylauryl (meth)acrylate, and (4-hydroxymethylcyclohexyl)methyl methacrylate; sulfonate group-containing monomers such as styrenesulfonic acid, allylsulfonic acid, 2-(meth)acrylamide-2-methylpropanesulfonic acid, (meth) acrylamidepropanesulfonic acid, sulfopropyl(meth)acrylate, and (meth) acryloyloxynaphthalenesulfonic acid; phosphate group-containing monomers such as 2-hydroxyethylacryloylphosphate; (N-substituted) amide monomers such as (meth)acrylamide, N,N-dimethyl(meth)acrylamide, N-butyl(meth)acrylamide, N-methylol(meth)acrylamide, and N-methylolpropane (meth)acrylamide; aminoalkyl(meth)acrylate monomers such as aminoethyl (meth)acrylate, N,N-dimethlaminoethyl (meth)acrylate, and t-butylaminoethyl (meth)acrylate; alkoxyalkyl (meth)acrylate monomers such as methoxyethyl (meth)acrylate and ethoxyethyl (meth)acrylate; cyanoacrylate monomers such as acrylonitrile and methacrylonitrile; epoxy group-containing acrylic monomers such as glycidyl (meth)acrylate; styrene monomers such as styrene and α-methylstyrene; vinylester monomers such as vinyl acetate and vinyl propionate; olefin monomers such as isoprene, butadiene, and isobutylene; vinylether monomers such as vinylether; nitrogen-containing monomers such as N-vinylpyrrolidone, methylvinylpyrrolidone, vinylpyridine, vinylpiperidone, vinylpyrimidine, vinylpiperazine, vinylpyrazine, vinylpyrrole, vinylimidazole, vinyloxazole, vinylmorpholine, N-vinylcarboxylic acid amides, and N-vinylcaprolactam; maleimide monomers such as N-cyclohexylmaleimide, N-isopropylmaleimide, N-laurylmaleimide, and N-phenylmaleimide; itaconimide monomers such as N-methylitaconimide, N-ethylitaconimide, N-butylitaconimide, N-octylitaconimide, N-2-ethylhexylitaconimide, N-cyclohexylitaconimide, and N-laurylitaconimide; succinimide monomers such as N-(meth)acryloyloxymethylene succinimide, N-(meth)acryloyl-6-oxyhexamethylene succinimide, and N-(meth)acryloyl-8-oxyoctamethylene succinimide; glycol acrylester monomers such as polyethylene glycol (meth)acrylate, polypropylene glycol (meth)acrylate, methoxyethylene glycol (meth)acrylate, and methoxypolypropylene glycol (meth)acrylate; acrylate monomers having a heterocyclic ring, a halogen atom, a silicon atom, and the like such as tetrahydrofurfuryl (meth)acrylate, fluorine (meth) acrylate, and silicone (meth)acrylate; and polyfunctional monomers such as hexanediol di(meth)acrylate, (poly)ethylene glycol di(meth)acrylate, (poly) propylene glycol di(meth)acrylate, neopentyl glycol di(meth)acrylate, pentaerythritol di(meth)acrylate, trimethylolpropane tri(meth) acrylate, pentaerythritol tri(meth)acrylate, dipentaerythritol hexa(meth)acrylate, epoxyacrylate, polyesteracrylate, urethaneacrylate, divinylbenzene, butyl di(meth)acrylate, and hexyl di(meth)acrylate. One type or two types or more of these copolymerizable monomer components can be used.

When a radiation curing type pressure-sensitive adhesive (or an energy ray curing type pressure-sensitive adhesive) is used as the pressure-sensitive adhesive, examples of the radiation curing type pressure-sensitive adhesive (composition) include an internal radiation curing type pressure-sensitive adhesive having a polymer with a radical reactive carbon-carbon double bond in the polymer side chain, the main chain, or the ends of the main chain as a base polymer and a radiation curing type pressure-sensitive adhesive in which ultraviolet-ray curing-type monomer component and oligomer component are compounded in the pressure-sensitive adhesive. When a thermally expandable pressure-sensitive adhesive is used as the pressure-sensitive adhesive, examples thereof include a thermally expandable pressure-sensitive adhesive containing a pressure-sensitive adhesive and a foaming agent (especially, a thermally expandable microsphere).

In the present invention, the pressure-sensitive adhesive layer 32 may contain various additives such as a tackifier, a coloring agent, a thickener, an extender, a filler, a plasticizer, an anti-aging agent, an antioxidant, a surfactant, and a crosslinking agent as long as the effects of the present invention are not deteriorated.

The crosslinking agent is not especially limited, and known crosslinking agents can be used. Specific examples of the crosslinking agent include an isocyanate crosslinking agent, an epoxy crosslinking agent, a melamine crosslinking agent, a peroxide crosslinking agent, a urea crosslinking agent, a metal alkoxide crosslinking agent, a metal chelate crosslinking agent, a metal salt crosslinking agent, a carbodiimide crosslinking agent, an oxazoline crosslinking agent, an aziridine crosslinking agent, and an amine crosslinking agent, and an isocyanate crosslinking agent and an epoxy crosslinking agent are preferable. The crosslinking agents can be used alone or two types or more can be used together. The amount of the crosslinking agent used is not especially limited.

Examples of the isocyanate crosslinking agent include those described in the present specification as the isocyanate crosslinking agent capable of being added to the resin composition for the film 2 for the backside of a semiconductor.

In the present invention, a crosslinking treatment can be performed by irradiation with an electron beam, an ultraviolet ray, or the like instead of using the crosslinking agent or in addition to the use of the crosslinking agent.

The pressure-sensitive adhesive layer 32 can be formed by a common method of forming a sheet-like layer by mixing the pressure-sensitive adhesive with a solvent, other additives, and the like as necessary. Specifically, the pressure-sensitive adhesive layer 32 can be produced by a method of applying the pressure-sensitive adhesive or a mixture containing the pressure-sensitive adhesive, a solvent and other additives to the base 31, a method of forming the pressure-sensitive adhesive layer 32 by applying the above-described mixture to an appropriate separator (release paper, for example), and transferring (adhering) the resultant onto the base 31, for example.

The thickness of the pressure-sensitive adhesive layer 32 is not especially limited, and is preferably 5 to 300 μm, more preferably 5 to 200 μm, still more preferably 5 to 100 μm, and especially preferably 7 to 50 μm. When the thickness of the pressure-sensitive adhesive layer 32 is in the above-described range, adequate adhesive power can be exhibited. The pressure-sensitive adhesive layer 32 may be a single layer or a plurality of layers.

The adhering strength (23° C., peeling angle 180°, peeling speed 300 mm/min) of the pressure-sensitive adhesive layer 32 of the dicing tape 3 to the film 2 for the backside of a flip-chip semiconductor is preferably in a range of 0.02 N/20 mm to 10 N/20 mm, and more preferably 0.05 N/20 mm to 5 N/20 mm. By making the adhering strength 0.02 N/20 mm or more, chip flying of a semiconductor element can be prevented when dicing the semiconductor wafer. Meanwhile, by making the adhering strength 10 N/20 mm or less, difficulty in peeling the semiconductor element off and generation of adhesive residue can be prevented when picking the semiconductor element up.

(1-3) Dicing Tape-Integrated film 1 for Backside of Semiconductor

As shown in FIG. 1, a dicing tape-integrated film 1 for the backside of a semiconductor has a dicing tape 3 in which a pressure-sensitive adhesive layer 32 is provided on a base 31 and a film 2 for the backside of a semiconductor that is provided on the pressure-sensitive adhesive layer 32. As shown in FIG. 1, the dicing tape-integrated film for the backside of a semiconductor, which can be used in the present invention, may have a configuration in which the film 2 for the backside of a semiconductor is formed only on a portion 33 that corresponds to a pasting portion of the semiconductor wafer on the pressure-sensitive adhesive layer 32 of the dicing tape 3. However, the film may have a configuration in which the film for the backside of a semiconductor is formed on the entire surface of the pressure-sensitive adhesive layer 32, or it may have a configuration in which the film for the backside of a semiconductor is formed on a portion that is larger than the portion 33 that corresponds to the pasting portion of the semiconductor wafer and smaller than the entire surface of the pressure-sensitive adhesive layer 32. The surface (the surface that is pasted to the backside of the wafer) of the film 2 for the backside of a semiconductor may be protected with a separator, or the like until it is pasted to the backside of the wafer.

In the present invention, an antistatic function can be imparted to the film 2 for the backside of a flip-chip type semiconductor and the dicing tape-integrated film 1 for the backside of a semiconductor. With this configuration, generation of static electricity on the films during adhesion and peeling and damage to the circuit due to electrification of the semiconductor wafer and the like can be prevented. The antistatic function can be imparted by an appropriate method such as a method of adding an antistatic agent or a conductive substance to the base 31, the pressure-sensitive adhesive layer 32, or the film 2 for the backside of a semiconductor and a method of providing a conductive layer made of a charge-transfer complex or a metal film to the base 31. A method of giving the antistatic function is preferable with which impurity ions that can deteriorate the semiconductor wafer are hardly generated. Examples of the conductive substance (conductive filler) that is compounded to give electric conductivity and to improve heat conductivity include spherical, needle-like, and flaky metal powders of silver, aluminum, gold, copper, nickel, and conductive alloys, metal oxides of alumina, amorphous carbon black, and graphite. However, the film 2 for the backside of a semiconductor are preferably electrically non-conductive from the viewpoint of making the films have no electrical leakage.

The film 2 for the backside of a flip-chip type semiconductor and the dicing tape-integrated film 1 for the backside of a semiconductor may be formed in a form in which the films are wound into a roll or a form in which the sheets (films) are laminated. When the films have a form in which they are wound into a roll, a dicing tape-integrated film 1 for the backside of a semiconductor having a state or a form in which the films are wound into a roll can be produced by winding the film 2 for the backside of a semiconductor or a laminated body of the film 2 for the backside of a semiconductor and the dicing tape 3 into a roll while protecting the film or the laminated body with a separator as necessary. The film 2 for the backside of a semiconductor and the dicing tape-integrated film 1 for the backside of a semiconductor having a state or a form in which the films are wound into a roll may be configured with the base 31, the pressure-sensitive adhesive layer 32 that is formed on one side of the base 31, a film for the backside of a semiconductor that is formed on the pressure-sensitive adhesive layer 32, and a release treatment layer (a back treatment layer) that is formed on the other surface of the base 31.

The thickness (total thickness of the thickness of the film for the backside of a semiconductor and the thickness of the dicing tape made of the base 31 and the pressure-sensitive adhesive layer 32) of the dicing tape-integrated film 1 for the backside of a semiconductor can be selected from a range of 8 to 1500 μm, preferably 20 to 850 μm, more preferably 31 to 500 μm, and especially preferably 47 to 330 μm.

By controlling the ratio between the thickness of the film 2 for the backside of a semiconductor and the thickness of the pressure-sensitive adhesive layer 32 of the dicing tape 3 and the ratio between the thickness of the film 2 for the backside of a semiconductor and the thickness of the dicing tape 3 (total thickness of the base 31 and the pressure-sensitive adhesive layer 32) in the dicing tape-integrated film 1 for the backside of a semiconductor, the dicing property in a dicing step, the pickup property in a pickup step, and the like can be improved, and the dicing tape-integrated film 1 for the backside of a semiconductor can be effectively used from the dicing step of a semiconductor wafer to the flip-chip bonding step of a semiconductor chip.

A method of manufacturing the dicing tape-integrated film for the backside of a semiconductor is explained using the dicing tape-integrated film 1 for the backside of a semiconductor shown in FIG. 1 as an example. First, the base 31 can be formed by a conventionally known film forming method. Examples of the film forming method include a calender film forming method, a casting method in an organic solvent, an inflation extrusion method in a closed system, a T die extrusion method, a co-extrusion method, and a dry laminating method.

The pressure-sensitive adhesive layer 32 is formed by applying a pressure-sensitive adhesive composition to the base 31 and drying the composition (by crosslinking by heat as necessary). Examples of the application method include roll coating, screen coating, and gravure coating. The pressure-sensitive adhesive layer 32 may be formed on the base 31 by applying the pressure-sensitive adhesive composition directly to the base 31, or the pressure-sensitive adhesive layer 32 may be transferred to the base 31 after the pressure-sensitive adhesive layer 32 is formed by applying the pressure-sensitive adhesive composition to a release paper, a surface of which has been subjected to a release treatment. With this configuration, the dicing tape 3 is produced in which the pressure-sensitive adhesive layer 32 is formed on the base 31.

The material for forming the film 2 for the backside of a semiconductor is applied onto release paper to have a prescribed thickness after drying, and further dried under a prescribed condition to form a coating layer. The coating layer is transcribed onto the pressure-sensitive adhesive layer 32 to form the film 2 for the backside of a semiconductor on the pressure-sensitive adhesive layer 32. The material for forming the film 2 for the backside of a semiconductor can be directly applied onto the pressure-sensitive adhesive layer 32 and dried under a prescribed condition to form the film 2 for the backside of a semiconductor on the pressure-sensitive adhesive layer 32. With the above, the dicing tape-integrated film 1 for the backside of a semiconductor according to the present invention can be obtained.

The dicing tape-integrated film 1 for the backside of a semiconductor used in the present invention can be used suitably in the manufacture of a flip-chip type semiconductor device of the present invention. The dicing tape-integrated film 1 for the backside of a semiconductor is used to manufacture a flip-chip mounted semiconductor device, and the flip-chip mounted semiconductor device is manufactured in a form in which the film 2 for the backside of a semiconductor of the dicing tape-integrated film 1 for the backside of a semiconductor is pasted to the backside of the semiconductor chip. Therefore, the dicing tape-integrated film 1 for the backside of a semiconductor can be used for a flip-chip mounted semiconductor device (a semiconductor device in a form in which the semiconductor chip is fixed to an adherend such as a substrate by a flip-chip bonding method). The film 2 for the backside of a semiconductor can be also used in a flip-chip mounted semiconductor device in the same manner as the dicing tape-integrated film 1 for the backside of a semiconductor.

(1-4) Semiconductor Wafer

The semiconductor wafer is not especially limited as long as it is a known or common semiconductor wafer, and semiconductor wafers made of various materials can be appropriately selected and used. In the present invention, a silicon wafer can be suitably used as the semiconductor wafer.

(2) Step B

As shown in FIG. 2(*b*), dicing of the semiconductor wafer 4 is performed. With this operation, the semiconductor wafer 4 is cut into individual pieces (cut into small pieces) having a prescribed size, and a semiconductor chip 5 is manufactured. The dicing is performed from the circuit surface side of the semiconductor wafer 4 by a normal method, for example. For example, a cutting method called full cut in which cutting is performed up to the dicing tape-integrated film 1 for the backside of a semiconductor can be adopted in this step. The dicing apparatus used in this step is not especially limited, and a conventionally known apparatus can be used. Because the semiconductor wafer 4 is adhered and fixed with excellent adhesion by the dicing tape-integrated film 1 for the backside of a semiconductor having the film for the backside of a semiconductor, chip cracks and chip fly can be suppressed and damage to the semiconductor wafer 4 can also be suppressed. When the film 2 for the backside of a semiconductor is formed of a resin composition containing an epoxy resin, the occurrence of protrusions of the adhesive layer of the film for the backside of a semiconductor at a surface cut by dicing can be suppressed or prevented. As a result, reattachment (blocking) of the cut surfaces can be suppressed or prevented, and pickup described later can be performed more favorably.

When expanding the dicing tape-integrated film 1 for the backside of a semiconductor, a conventionally known expanding apparatus can be used. The expanding apparatus has a donut-shaped outer ring that can push down the dicing tape-integrated film 1 for the backside of a semiconductor through a dicing ring and an inner ring that has a smaller diameter than the outer ring and that supports the dicing tape-integrated film for the backside of a semiconductor. With this expanding step, occurrence of damage caused by the contact between adjacent semiconductor chips can be prevented in the pickup step described later.

(3) Step C

In the step C, the film 2 for the backside of a semiconductor is subjected to laser marking, and the film 2 for the backside of a semiconductor in the step C is in an uncured state. The uncured state used herein refers to a state before the film is completely cured, and includes a semi-cured state in which the crosslinking reaction is promoted to the extent that the film is not cured. That is, it means that a step of curing the film 2 for the backside of a semiconductor is not included before the step C.

In the present invention, it is possible to perform laser marking even when the film 2 for the backside of a semiconductor is in an uncured state, and the film 2 for the backside of a semiconductor can be thermally cured together with a sealing material in the sealing step. Therefore, it is not necessary to add a separate step of thermally curing the film 2 for the backside of a semiconductor.

A processing depth at laser marking is preferably 0% to 10%, and more preferably 0% to 5%. The processing depth refers to a processing depth to the thickness of the film 2 for the backside of a semiconductor.

A known laser marking apparatus can be used when performing laser marking. Various lasers such as a gas laser, a solid laser, and a liquid laser can be used. Specifically, the gas laser is not especially limited, and a known gas laser can be used. However, a carbon dioxide gas laser ($CO_2$ laser) and an excimer laser such as an ArF laser, a KrF laser, an XeCl laser, or an XeF laser are suitable. The solid laser is not especially limited, and a known solid laser can be used. However, a YAG laser such as an Nd:YAG laser and a $YVO_4$ laser are suitable.

The irradiation conditions of the laser when the laser marking is performed can be appropriately set in consideration of the contrast of a marking portion to a portion other than the marking portion, the processing depth, etc., and can be, for example, in the following range when a laser marking apparatus: trade name "MD-S9900" manufactured by Keyence Corporation is used.

(Laser Irradiation Conditions)
Wavelength: 532 nm
Intensity: 1.0 W
Scan Speed: 700 mm/second
Q Switch Frequency: 64 kHz
(4) Other Steps
(4-1) Pickup Step The semiconductor chip 5 is peeled from the dicing tape 3 together with the film 2 for the backside of a semiconductor by performing pickup of the semiconductor chip 5 as shown in FIG. 2(*c*) to collect the semiconductor chip 5 that is adhered and fixed to the dicing tape-integrated film 1 for the backside of a semiconductor. The pickup method is not especially limited, and various conventionally known methods can be adopted. An example of the method is a method of pushing up an individual semiconductor chip 5 from the side of the base 31 of the dicing tape-integrated film 1 for the backside of a semiconductor with a needle and picking up the pushed semiconductor chip 5 with a pickup apparatus. The backside of the semiconductor chip 5 that is picked up is protected by the film 2 for the backside of a semiconductor.

(4-2) Flip-Chip Connecting Step

As shown in FIG. 2(*d*), the semiconductor chip 5 that is picked up is fixed to an adherend such as a substrate by a flip-chip bonding method (flip-chip mounting method). Specifically, the semiconductor chip 5 is fixed to an adherend 6 by a normal method in a form that the circuit surface (also referred to as the surface, a circuit pattern forming surface, or an electrode forming surface) of the semiconductor chip 5 faces the adherend 6. The semiconductor chip 5 can be fixed to the adherend 6 while securing electrical conduction of the semiconductor chip 5 with the adherend 6 by contacting and pressing a bump 51 formed on the circuit surface side of the semiconductor chip 5 to a conductive material 61 such as solder for bonding that is adhered to a connection pad of the adherend 6 and melting the conductive material (a flip-chip bonding step). At this time, a space is formed between the semiconductor chip 5 and the adherend 6, and the distance of the space is generally about 30 to 300 µm. After flip-chip bonding (flip-chip connection) of the semiconductor chip 5 onto the adherend 6, it is important to wash the facing surface and the space between the semiconductor chip 5 to the adherend 6 and to seal the space by filling the space with a sealing material such as a sealing resin.

Various substrates such as a lead frame and a circuit board (a wiring circuit board, for example) can be used as the adherend 6. The material of the substrate is not especially limited, and examples thereof include a ceramic substrate and a plastic substrate. Examples of the plastic substrate include an epoxy substrate, a bismaleimide triazine substrate, and a polyimide substrate.

The material of the bump and the conductive material in the flip-chip bonding step are not especially limited, and examples thereof include solders (alloys) of a tin-lead metal material, a tin-silver metal material, a tin-silver-copper metal material, a tin-zinc metal material, and a tin-zinc-bismuth metal material, a gold metal material, and a copper metal material.

In the flip-chip bonding step, the bump of the circuit surface side of the semiconductor chip 5 and the conductive material on the surface of the adherend 6 are connected by melting the conductive material. The temperature when the conductive material is molten is normally about 260° C. (250 to 300° C., for example). The dicing tape-integrated film for the backside of a semiconductor of the present invention can have heat resistance so that it can resist a high temperature in the flip-chip bonding step by forming the film for the backside of a semiconductor with an epoxy resin, or the like.

In this step, the facing surface (an electrode forming surface) and the space between the semiconductor chip 5 and the adherend 6 are preferably washed. The washing liquid that is used in washing is not especially limited, and examples thereof include an organic washing liquid and a water washing liquid. The film for the backside of a semiconductor in the dicing tape-integrated film for the backside of a semiconductor of the present invention has solvent resistance to the washing liquid, and does not substantially have solubility in these washing liquids. Because of that, various washing liquids can be used as the washing liquid, and washing can be performed by a conventional method without requiring a special washing liquid.

Next, a sealing step is performed to seal the space between the flip-chip bonded semiconductor chip 5 and the adherend 6. The sealing step is performed using a sealing resin. The sealing condition is not especially limited. Thermal curing of the sealing resin is performed normally by heating the sealing resin at 175° C. for 60 to 90 seconds. However, the present invention is not limited to this, and curing can be performed at 165 to 185° C. for a few minutes, for example. In the heat treatment in this step, thermal curing of not only the sealing resin but also of the film 2 for the backside of a semiconductor is performed at the same time. With this step, the film 2 for the backside of a semiconductor can be completely or almost completely thermally cured, and the layer can be pasted to the backside of the semiconductor element with excellent adhesion. The film 2 for the backside of a semiconductor that is used in the present invention is in an uncured state up to the step of laser marking, and the film can be thermally cured together with a sealing material in the sealing step. Therefore, it is not necessary to add a separate step of thermally curing the film 2 for the backside of a semiconductor.

The sealing resin is not especially limited as long as it is a resin having insulation properties (insulating resin), and can be appropriately selected from sealing materials such as a known sealing resin. However, an insulating resin having elasticity is preferable. Examples of the sealing resin include a resin composition containing an epoxy resin. Examples of the epoxy resin include epoxy resins described above. The sealing resin with a resin composition containing an epoxy resin may contain a thermosetting resin such as a phenol resin other than the epoxy resin, a thermoplastic resin, and the like as a resin component besides the epoxy resin. The phenol resin can also be used as a curing agent for the epoxy resin, and examples of the phenol resin include the above-described phenol resins.

Subsequently, a heat treatment (a reflow step that is performed after laser marking) is normally performed when a semiconductor package is mounted to a substrate (such as a motherboard). As for the conditions of the heat treatment (such as temperature and time), the heat treatment is performed in accordance with the standards by the Joint Electron Device Engineering Council (JEDEC). For example, the heat treatment can be performed at a temperature (upper limit) in a range of 210° C. to 270° C. and a time for 5 seconds to 50 seconds. This step makes it possible to mount a semiconductor package to a substrate (such as a motherboard). At this time, when a decrease rate of the contrast after the reflow step that is performed after laser marking is 20% or less, the visibility of various types of information that are produced by laser marking becomes good also after the reflow step.

Because the film for the backside of a semiconductor is pasted to the backside of a semiconductor chip in the semiconductor device (flip-chip mounted semiconductor device) that is manufactured using the dicing tape-integrated film 1 for the backside of a semiconductor and the film 2 for the backside of a semiconductor, various markings can be performed with excellent visibility. Even when marking is performed by a laser marking method, marking can be performed with an excellent contrast ratio, and various information such as character information and graphic information marked by laser marking can be visually recognized well.

The flip-chip type semiconductor device that is manufactured using the manufacturing method of the present invention can be suitably used as various electronic apparatuses and electronic parts or materials and members thereof. Specific examples of the electronic apparatus in which the flip-chip mounted semiconductor device of the present invention can be used include a portable phone, PHS, a small computer such as a PDA (personal digital assistant), a notebook personal computer, a Netbook (trademark), or a wearable computer, a small electronic apparatus in which a portable phone and a computer are integrated, a Digital Camera (trademark), a digital video camera, a small television, a small game machine, a small digital audio player, an electronic organizer, an electronic dictionary, an electronic apparatus terminal for an electronic book, and a mobile electronic apparatus (portable electronic apparatus) such as a small digital-type clock or watch. Examples of the electronic apparatus also include an electronic apparatus other than a mobile type apparatus (i.e., a stationary apparatus) such as a desktop personal computer, a flat-panel television, an electronic apparatus for recording and playing such as a hard disc recorder or a DVD player, a projector, or a micromachine. Examples of the electronic parts or materials and members of the electronic apparatus and electronic parts include a component of a CPU and components of various recording apparatuses such as a memory and a hard disk.

EXAMPLES

The preferred examples of the invention will be illustratively explained in detail below. However, the materials, the compounding amounts, etc. described in the Examples are not for limiting the gist of the invention to only those unless otherwise specified. In the Examples, parts means parts by weight.

Example 1

<Production of Colored Film A for Backside of Semiconductor>

Twelve parts of an epoxy resin (trade name "Epicoat 1004", manufactured by Japan Epoxy Resins Co., Ltd.), 13 parts of a phenol resin (trade name "Milex XLC-4L", manufactured by Mitsui Chemicals, Inc.), 92 parts of spherical silica (trade name "SO-25R", manufactured by Admatechs Co., Ltd.), 2 parts of a dye 1 (trade name "OIL GREEN 502", manufactured by Orient Chemical Industries Co., Ltd.), and 2 parts of a dye 2 (trade name "OIL BLACK BS", manufactured by Orient Chemical Industries Co., Ltd.) to 100 parts of an acrylic ester-based polymer (trade name "PARACRON W-197CM", manufactured by Negami Chemical Industrial Co., Ltd.) having ethylacrylate-methylmethacrylate as a main component were dissolved in methylethylketone to prepare a solution of an adhesive composition having a concentration of solid content of 23.6% by weight.

The solution of the adhesive composition was applied onto a release-treated film consisting of a silicon release-treated polyethylene terephthalate film having a thickness of 50 μm as a release liner (a separator), and dried at 130° C. for 2 minutes to produce a colored film A for the backside of a semiconductor having a thickness of 20 μm.

Example 2

<Production of Colored Film B for Backside of Semiconductor>

Twenty parts of an epoxy resin (trade name "Epicoat 1004", manufactured by Japan Epoxy Resins Co., Ltd.), 22 parts of a phenol resin (trade name "Milex XLC-4L", manufactured by Mitsui Chemicals, Inc.), 104 parts of spherical silica (trade name "SO-25R", manufactured by Admatechs Co., Ltd.), 2 parts of a dye 1 (trade name "OIL GREEN 502", manufactured by Orient Chemical Industries Co., Ltd.), and 2 parts of a dye 2 (trade name "OIL BLACK BS", manufactured by Orient Chemical Industries Co., Ltd.) to 100 parts of an acrylic ester-based polymer (trade name "PARACRON W-197CM", manufactured by Negami Chemical Industrial Co., Ltd.) having ethylacrylate-methylmethacrylate as a main component were dissolved in methylethylketone to prepare a solution of an adhesive composition having a concentration of solid content of 23.6% by weight.

The solution of the adhesive composition was applied onto a release-treated film consisting of a silicon release-treated polyethylene terephthalate film having a thickness of 50 μm as a release liner (a separator), and dried at 130° C. for 2 minutes to produce a colored film B for the backside of a semiconductor having a thickness of 20 μm.

Example 3

<Production of Colored Film C for Backside of Semiconductor>

Thirty two parts of an epoxy resin (trade name "Epicoat 1004", manufactured by Japan Epoxy Resins Co., Ltd.), 35 parts of a phenol resin (trade name "Milex XLC-4L", manufactured by Mitsui Chemicals, Inc.), 123 parts of spherical silica (trade name "SO-25R", manufactured by Admatechs Co., Ltd.), 2.5 parts of a dye 1 (trade name "OIL GREEN 502", manufactured by Orient Chemical Industries Co., Ltd.), and 2.5 parts of a dye 2 (trade name "OIL BLACK BS", manufactured by Orient Chemical Industries Co., Ltd.) to 100 parts of an acrylic ester-based polymer (trade name "PARACRON W-197CM", manufactured by Negami Chemical Industrial Co., Ltd.) having ethylacrylate-methylmethacrylate as a main component were dissolved in methylethylketone to prepare a solution of an adhesive composition having a concentration of solid content of 23.6% by weight.

The solution of the adhesive composition was applied onto a release-treated film consisting of a silicon release-treated polyethylene terephthalate film having a thickness of 50 μm as a release liner (a separator), and dried at 130° C. for 2 minutes to produce a colored film C for the backside of a semiconductor having a thickness of 20 μm.

Comparative Example 1

<Production of Colored Film D for Backside of Semiconductor>

Fifty-six parts of an epoxy resin 1 (trade name "Epicoat 1004", manufactured by Japan Epoxy Resins Co., Ltd.), 56 parts of an epoxy resin 2 (trade name "Epicoat 828", manufactured by Japan Epoxy Resins Co., Ltd.), 121 parts of a phenol resin (trade name "Milex XLC-4L", manufactured by Mitsui Chemicals, Inc.), 246 parts of spherical silica (trade name "SO-25R", manufactured by Admatechs Co., Ltd.), 5 parts of a dye 1 (trade name "OIL GREEN 502", manufactured by Orient Chemical Industries Co., Ltd.), 5 parts of a dye 2 (trade name "OIL BLACK BS", manufactured by Orient Chemical Industries Co., Ltd.), and 1.7 parts of a catalyst (trade name "TPP" manufactured by Hokko Chemical Industry Co., Ltd.) to 100 parts of an acrylic ester-based polymer (trade name "PARACRON W-197CM", manufactured by Negami Chemical Industrial Co., Ltd.) having ethylacrylate-methylmethacrylate as a main component were dissolved in methylethylketone to prepare a solution of an adhesive composition having a concentration of solid content of 23.6% by weight.

The solution of the adhesive composition was applied onto a release-treated film consisting of a silicon release-treated polyethylene terephthalate film having a thickness of 50 μm as a release liner (a separator), and dried at 130° C. for 2 minutes to produce a colored film D for the backside of a semiconductor having a thickness of 20 μm.

(Evaluations)

For the films for the backside of a semiconductor produced in Examples 1 to 3 and Comparative Example 1, the generation of burrs by dicing, the pickup property (%), the visibility of laser marking after reflow, the elastic modulus, and the adhering strength to a Si wafer were evaluated or measured with the following evaluation methods or measurement methods. The evaluation results and the measurement results are shown in Table 1.

(Bonding of Film to Dicing Tape)

The colored films A to D for the backside of a semiconductor were respectively bonded onto a pressure-sensitive adhesive layer of a dicing tape (trade name "V-8-T", manufactured by Nitto Denko Corporation) using a hand roller to produce dicing-sheet integrated sheets A to D for protecting the backside of a wafer, respectively.

(Grinding, Bonding, and Dicing of Semiconductor Wafer)

The backside of a semiconductor wafer (diameter 8 inch, thickness 0.6 mm; silicon mirror wafer) was ground to a thickness of 0.2 mm. After the separator was peeled from the dicing tape-integrated films A to D for the backside of a semiconductor, the above-described ground semiconductor wafer was bonded onto the film for the backside of a semiconductor by roll pressing at 70° C. Then, dicing of the semiconductor wafer was performed. In dicing, the semiconductor wafer was fully cut into chips each having a size of 10 mm square. The grinding conditions, bonding conditions, and dicing conditions of the semiconductor wafer are as follows.

[Grinding Conditions of Semiconductor Wafer]

Grinding apparatus: Trade name "DFG-8560" manufactured by DISCO Corporation

Semiconductor wafer: 8 inch diameter (backside was ground from a thickness of 0.6 mm to 0.2 mm)

[Bonding Conditions]

Bonding apparatus: Trade name "MA-30001II" manufactured by Nitto Seiki Co., Ltd.

Bonding rate: 10 mm/minute

Bonding pressure: 0.15 MPa

Stage temperature at bonding: 70° C.

[Dicing Conditions]

Dicing apparatus: Trade name "DFD-6361" manufactured by DISCO Corporation

Dicing ring: "2-8-1" (manufactured by DISCO Corporation)

Dicing rate: 30 mm/second

Dicing blade:
Z1; "203O-SE 27HCDD" manufactured by DISCO Corporation
Z2; "203O-SE 27HCBB" manufactured by DISCO Corporation Rotational speed of dicing blade
Z1; 40,000 rpm
Z2; 45,000 rpm Cutting method: Step cut Size of wafer chip: 10.0 mm square <Method of Evaluating Burrs by Dicing>

Thirty semiconductor chips were formed in dicing described above. The obtained semiconductor chips were observed with a microscope, the situation of generation of burrs was checked and evaluated according to the following evaluation criteria:

○: No generation of burrs x: One or more burrs having a length of 100 μm or more were generated <Method of Evaluating Pickup Property>

The chip-shaped workpiece that was obtained by dicing was pushed up from the dicing tape side of the dicing tape-integrated film for the backside of a semiconductor with a needle to be peeled from the pressure-sensitive adhesive layer of the dicing tape together with the film for the backside of a semiconductor, and the chip-shaped workpiece with a backside that was protected by the film for the backside of a semiconductor was picked up. The pickup rate (%) of the chips (total number of chips: 400) at this time was determined to evaluate the pickup property. Therefore, the pickup property is better as the pickup rate becomes closer to 100%. The pickup conditions are as follows.

[Semiconductor Wafer Pickup Conditions]

Pickup Apparatus: Trade name "SPA-300", manufactured by Shinkawa Ltd.

Number of pickup needles: 9

Needle push-up rate: 20 mm/s

Needle push-up amount: 500 μm

Pickup time: 1 second

Dicing tape expanding amount: 3 mm

<Visibility of Laser Marking after Reflow>

The surface (the circuit surface) of the obtained chip-shaped workpiece was placed to face the surface of the circuit board having wiring that corresponds to the circuit surface. With this configuration, the bumps that were formed on the circuit surface of the chip-shaped workpiece were brought into contact with a conductive material (solder) for bonding that adhered to the connecting pads of the circuit board, and pressed. While pressing, the temperature was increased to 260° C. to melt the conductive material. After that, the temperature was decreased to room temperature to fix the chip-shaped workpiece to the circuit board so that a semiconductor device was produced. The processing of characters and two-dimensional codes was performed on the surface of the protective film (thickness: 20 μm) for the backside of a semiconductor of the obtained semiconductor device with the following conditions, and the evaluation was performed with the following evaluation criteria.

◯: The characters that were formed by laser marking were visible to the eye (distance measured to eyes: about 40 cm), and the two-dimensional codes were readable with a two-dimensional code reader (trade name "SR-600" manufactured by Keyence Corporation, distance between the two-dimensional codes and the two-dimensional code reader when the codes were read: 10 cm or less).

x: The characters that were formed by laser marking were invisible to the eye or the two-dimensional codes were unreadable by the two-dimensional code reader.

[Laser Marking Conditions]

Laser marking apparatus: trade name "MD-S9900" manufactured by Keyence Corporation
  Wavelength: 532 nm
  Intensity: 1.0 W
  Scan speed: 700 mm/second
  Q Switch Frequency: 64 kHz The two-dimensional code was processed having an entire size of about 4 mm×about 4 mm and a size of each cell of 0.08 mm×0.24 mm. The types of the characters were not especially limited.

<Elastic Modulus of Film in Uncured State>

The measurement was performed on each of the obtained colored films A to D for the backside of a semiconductor that were in an uncured state in a tensile mode with a sample width of 10 mm, a sample length of 22.5 mm, and a sample thickness of 0.2 mm at a frequency of 1 Hz, a rising temperature rate of 10° C./minute, and at prescribed temperature (23° C.) under a nitrogen environment using a dynamic viscoelasticity measurement apparatus "Solid Analyzer RS A2" manufactured by Rheometric Scientific, Inc. to obtain the tensile storage elastic modulus.

<Elastic Modulus after Curing>

The elastic modulus was obtained in the same manner as the method of measuring the <Elastic Modulus of Film in Uncured State> except that the film 2 for the backside of a semiconductor was cured (175° C., 1 hour).

<Adhering Strength to Si Wafer>

A pressure-sensitive adhesive tape (trade name "BT315" manufactured by Nitto Denko Corporation) was bonded to one surface of each of the obtained colored films A to D for the backside of a semiconductor that were in an uncured state to reinforce the backside. After that, the semiconductor wafer 4 having a thickness of 0.6 mm was bonded to the front surface of each of the colored films A to D for the backside of a semiconductor having a length of 150 mm and a width of 10 mm, backsides of which were reinforced, with a heat laminating method at 50° C. by moving a roller of 2 kg back and forth once. After that, the laminates were left to stand at rest on a hot plate (50° C.) for 2 minutes, and then at normal temperature (about 23° C.) for 20 minutes. Then, the colored films A to D for the backside of a semiconductor with reinforced backsides were peeled off at a temperature of 23° C. under the conditions of a peeling angle of 180° and tensile rate of 300 mm/minute using a peeling tester (trade name "AUTOGRAPH AGS-J" manufactured by Shimadzu Corporation). The adhering strength is a value (N/10 mm width) that is measured by peeling off the colored films A to D for the backside of a semiconductor at the interface with the semiconductor wafer.

TABLE 1

| | Example 1 | Example 2 | Example 3 | Comparative Example 1 |
|---|---|---|---|---|
| Generation of Dicing Burrs | ◯ | ◯ | ◯ | X |
| Pickup Property (%) | 100 | 100 | 85 | 85 |
| Visibility of Laser Marking After Reflow | ◯ | ◯ | ◯ | X |
| Elastic Modulus (GPa) Before Curing | 0.4 | 0.5 | 0.6 | 0.8 |
| Elastic Modulus (GPa) After Curing | 0.4 | 0.5 | 0.5 | 0.9 |
| Adhering Strength (N/10 mm width) to Si Wafer | 3.7 | 5.2 | 5.3 | 8.1 |

No generation of burrs was observed, and a good pickup property and the visibility of laser marking were exhibited in Examples 1 to 3. On the other hand, generation of burrs was observed, and the pickup property and the visibility of laser marking deteriorated in Comparative Example 1. In the case of laser marking the colored film D for the backside of a semiconductor as Comparative Example 1, it was necessary to perform the laser marking after the film was cured.

DESCRIPTION OF REFERENCE CHARACTERS

1 Dicing-Tape Integrated Film for Backside of Semiconductor
2 Film for Backside of Semiconductor
3 Dicing Tape
31 Base
32 Pressure-Sensitive Adhesive Layer
33 Portion Corresponding to Bonding Portion of Semiconductor Wafer
4 Semiconductor Wafer
5 Semiconductor Chip
51 Bump Formed on Circuit Surface Side of Semiconductor Chip 5
6 Adherend
61 Conductive Material for Bonding Adhered to Connecting Pad of Adherend 6

The invention claimed is:

1. A method of manufacturing a flip-chip type semiconductor device comprising:
   a step A of laminating on a semiconductor wafer a film for the backside of a flip-chip type semiconductor, in which the film is to be formed on the backside of a semiconductor element that is flip-chip connected onto an adherend;
   a step B of dicing the semiconductor wafer; and
   a step C of laser marking the film for the backside of a flip-chip type semiconductor, wherein
   the film for the backside of a flip-chip type semiconductor in the step C is uncured, and formed from a resin composition containing an epoxy resin and a phenol resin, and the total amount of the epoxy resin and the phenol resin is 10 to 25 parts by weight to 100 parts by weight of the resin composition.

2. A flip-chip type semiconductor device obtained with the manufacturing method according to claim 1, comprising a semiconductor element that is flip-chip connected onto an adherend and a film for the backside of a flip-chip type semiconductor laminated on the backside of the semiconductor element, wherein the film for the backside of a flip-chip type semiconductor is formed from a resin composition containing an epoxy resin and a phenol resin;

the total amount of the epoxy resin and the phenol resin is 10 to 25 parts by weight to 100 parts by weight of the resin composition; and laser marking is applied on the film for the backside of a flip-chip type semiconductor.

3. The method of manufacturing a flip-chip type semiconductor device according to claim 1, wherein the film for the backside of a flip-chip type semiconductor contains 0.01 to 10 parts by weight of a coloring agent to 100 parts by weight of the resin composition.

* * * * *